(12) United States Patent
Suzuki et al.

(10) Patent No.: US 12,205,642 B2
(45) Date of Patent: Jan. 21, 2025

(54) MEMORY DEVICE

(71) Applicant: Kioxia Corporation, Tokyo (JP)

(72) Inventors: Kunifumi Suzuki, Yokkaichi Mie (JP); Yuuichi Kamimuta, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 209 days.

(21) Appl. No.: 17/841,287

(22) Filed: Jun. 15, 2022

(65) Prior Publication Data

US 2023/0170018 A1 Jun. 1, 2023

(30) Foreign Application Priority Data

Nov. 30, 2021 (JP) .................. 2021-194450

(51) Int. Cl.
*G11C 13/00* (2006.01)
*G11C 5/06* (2006.01)
(52) U.S. Cl.
CPC .............. *G11C 13/004* (2013.01); *G11C 5/06* (2013.01); *G11C 13/0004* (2013.01); *G11C 13/0038* (2013.01); *G11C 13/0069* (2013.01)
(58) Field of Classification Search
CPC .................................. G11C 13/0004
USPC ......................................... 365/148
See application file for complete search history.

(56) References Cited

U.S. PATENT DOCUMENTS

| | | | |
|---|---|---|---|
| 9,484,090 B2 | 11/2016 | Yoshimoto et al. | |
| 10,354,729 B1 | 7/2019 | Wang et al. | |
| 2015/0263069 A1 | 9/2015 | Jo | |
| 2019/0122732 A1 | 4/2019 | Jo | |
| 2022/0068391 A1* | 3/2022 | Tortorelli | G11C 16/24 |

FOREIGN PATENT DOCUMENTS

| | | |
|---|---|---|
| JP | 6714512 B2 | 6/2020 |
| WO | WO-2012/102025 A1 | 8/2012 |
| WO | WO-2014/196142 A1 | 12/2014 |

OTHER PUBLICATIONS

T. Ravsher et al., "Polarity-dependent threshold voltage shift in ovonic threshold switches: Challenges and opportunities", 2021 IEEE International Electron Devices Meeting (IEDM), 2021, pp. (28.4.1)-(28.4.4), DOI: 10.1109/IEDM19574.2021.9720649; 4 pages.

* cited by examiner

*Primary Examiner* — Anthan Tran

(74) *Attorney, Agent, or Firm* — Foley & Lardner LLP

(57) ABSTRACT

According to one embodiment, a memory device includes a memory cell including a resistance change memory portion and a switching portion, and a voltage applying circuit carrying out, at a time of writing data to the memory cell, an operation of applying a voltage of a first polarity to the memory cell and applying a first voltage to the memory cell, an operation of applying a voltage of a second polarity to the memory cell and applying a second voltage to the memory cell, an operation of applying a voltage of the first polarity to the memory cell and applying a third voltage to the memory cell, or an operation of applying a voltage of the second polarity to the memory cell and applying a fourth voltage to the memory cell.

11 Claims, 20 Drawing Sheets

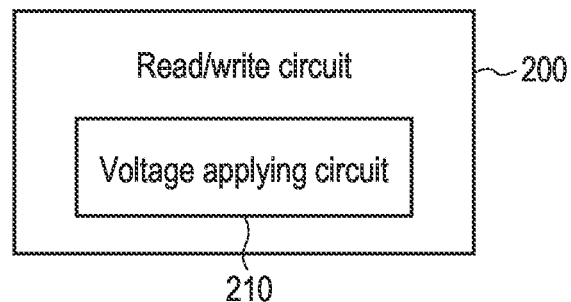
F I G. 7
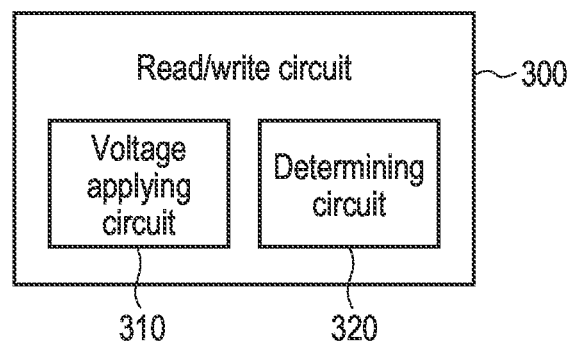
F I G. 8

MEMORY DEVICE

CROSS-REFERENCE TO RELATED APPLICATIONS

This application is based upon and claims the benefit of priority from Japanese Patent Application No. 2021-194450, filed Nov., 30, 2021, the entire contents of which are incorporated herein by reference.

FIELD

Embodiments described herein relate generally to a memory device.

BACKGROUND

A memory device in which memory cells including phase change memory (PCM) elements and selectors (switching elements) are integrated on a semiconductor substrate is proposed.

BRIEF DESCRIPTION OF THE DRAWINGS

FIG. 7 is a block diagram showing the functional configuration of the read/write circuit according to the first embodiment and shown in FIG. 1.

FIG. 8 is a block diagram showing the functional configuration of the read/write circuit according to the first embodiment and shown in FIG. 1.

DETAILED DESCRIPTION

In general, according to one embodiment, a memory device includes: a first wiring line extending in a first direction; a second wiring line extending in a second direction intersecting the first direction; a memory cell which is connected between the first wiring line and the second wiring line, includes a resistance change memory portion having a first resistance state and a second resistance state having resistance higher than that of the first resistance state and a switching portion connected in series to the resistance change memory portion, and stores data based on a resistance state set to the resistance change memory portion and a state of the switching portion; and a voltage applying circuit which carries out, at a time of writing data to the memory cell, a voltage applying operation selected from a first voltage applying operation, a second voltage applying operation, a third voltage applying operation, and a fourth voltage applying operation, wherein the first voltage applying operation is an operation of setting first data to the memory cell by applying a voltage of a first polarity to the memory cell through the first wiring line and the second wiring line and thereafter applying a first voltage to the memory cell through the first wiring line and the second wiring line to thereby set the resistance change memory portion to the first resistance state, the second voltage applying operation is an operation of setting second data to the memory cell by applying a voltage of a second polarity opposite to the first polarity to the memory cell through the first wiring line and the second wiring line and thereafter applying a second voltage to the memory cell through the first wiring line and the second wiring line to thereby set the resistance change memory portion to the first resistance state, the third voltage applying operation is an operation of setting third data to the memory cell by applying a voltage of the first polarity to the memory cell through the first wiring line and the second wiring line and thereafter applying a third voltage to the memory cell through the first wiring line and the second wiring line to thereby set the resistance change memory portion to the second resistance state, and the fourth voltage applying operation is an operation of setting fourth data to the memory cell by applying a voltage of the second polarity to the memory cell through the first wiring line and the second wiring line and thereafter applying a fourth voltage to the memory cell through the first wiring line and the second wiring line to thereby set the resistance change memory portion to the second resistance state.

Embodiments will be described hereinafter with reference to the accompanying drawings.

First Embodiment

Figure 1:
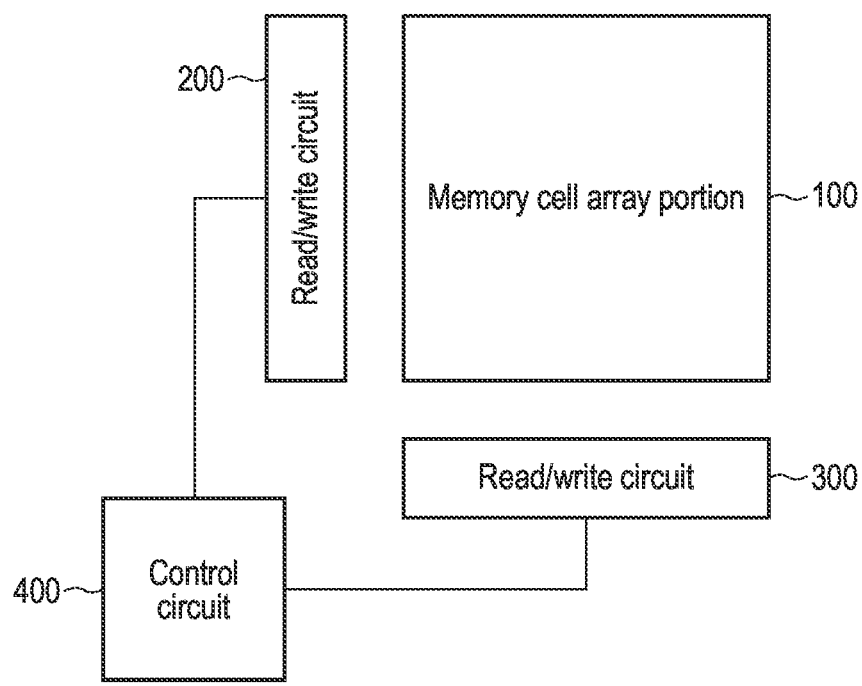
FIG. 1 is a block diagram showing the overall schematic configuration of a memory device according to a first embodiment.

FIG. 1 is a block diagram showing the overall schematic configuration of a memory device (resistance change nonvolatile memory device) according to a first embodiment.

The memory device of this embodiment includes a memory cell array portion 100 in which a plurality of memory cells are arranged in an array form, read/write circuits 200 and 300 configured to carry out read/write from/to the plurality of memory cells, and control circuit 400 configured to control the read/write circuits 200 and 300.

Figure 2:
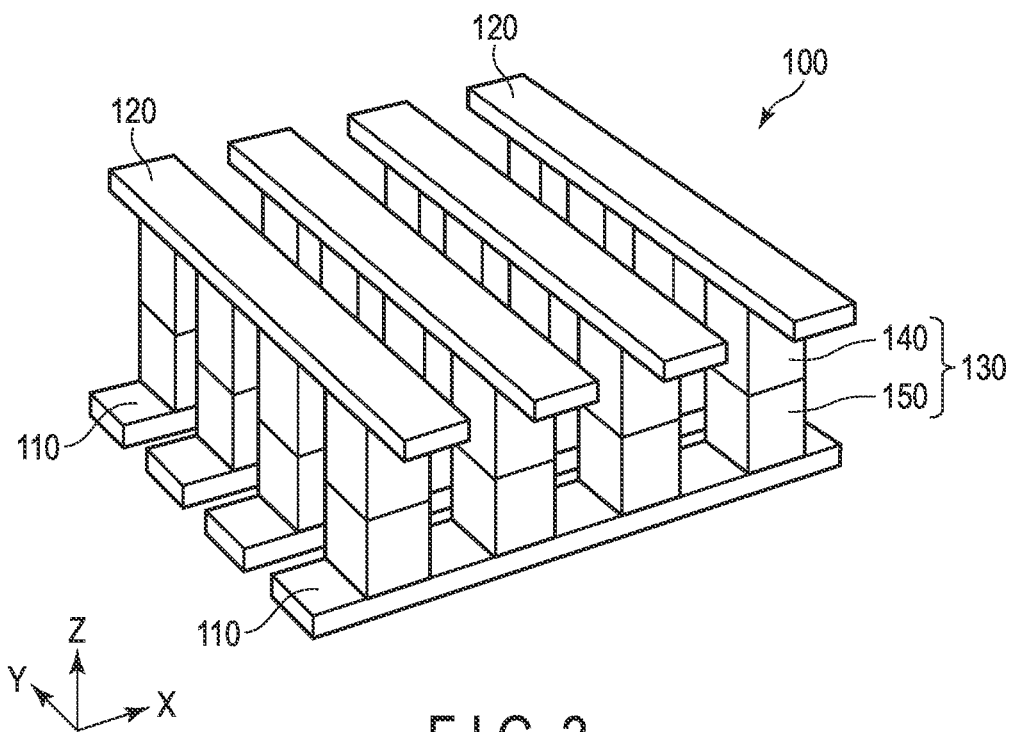
FIG. 2 is a perspective view schematically showing the configuration of a memory cell array portion according to the first embodiment.

FIG. 2 is a perspective view schematically showing the configuration of the memory cell array portion 100.

The memory cell array portion 100 is provided on a lower area (not shown) including a semiconductor substrate (not shown), and includes a plurality of wiring lines 110 extending in the X-direction, a plurality of wiring lines 120 extending in the Y-direction, and a plurality of memory cells 130 each of which is connected between each of the plurality of wiring lines 110 and each of the plurality of wiring lines 120. It should be noted that the X-direction, Y-direction, and Z-direction shown in FIG. 2 are directions intersecting each other. More specifically, the X-direction, Y-direction, and Z-direction intersect each other at right angles.

Each of the wiring lines 110 and each of the wiring lines 120 are respectively connected to the read/write circuit 200 and read/write circuit 300 shown in FIG. 1. One of the wiring line 110 and wiring line 120 corresponds to a word line and the other of the wiring line 110 and wiring line 120 corresponds to a bit line. In this embodiment, the wiring line 110 corresponds to the word line and wiring line 120 corresponds to the bit line.

The memory cell 130 includes a resistance change memory portion 140 functioning as a nonvolatile resistance change memory element and selector portion (switching portion) 150 connected in series to the resistance change memory portion 140 and functioning as a selector element (two-terminal switching element).

It should be noted that although in FIG. 2, the resistance change memory portion 140 is positioned on the upper layer side and selector portion 150 is positioned on the lower layer side, the resistance change memory portion 140 may be positioned on the lower layer side and selector portion 150 may be positioned on the upper layer side.

Figure 3:
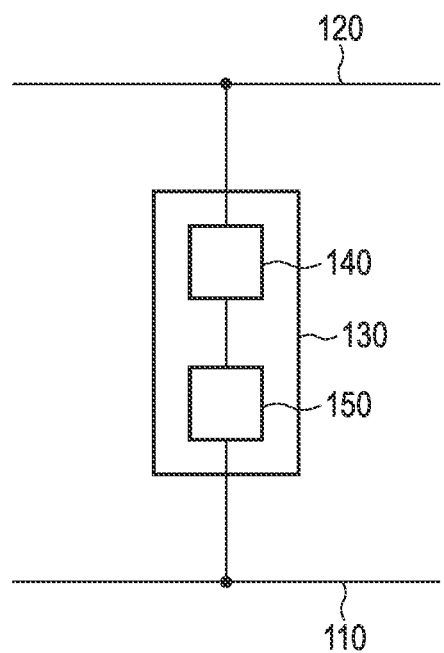
FIG. 3 is an equivalent circuit diagram showing a relationship between each of the wiring lines and memory cell according to the first embodiment.

FIG. 3 is an equivalent circuit diagram showing a relationship between each of the wiring line 110, wiring line 120, and memory cell 130.

As shown in FIG. 3, the memory cell 130 including a series connection of the resistance change memory portion 140 and selector portion 150 is connected between the wiring line 110 and wiring line 120. It should be noted that although in FIG. 3, the resistance change memory portion 140 is connected to the wiring line 120 and selector portion 150 is connected to the wiring line 110, the resistance change memory portion 140 may be connected to the wiring line 110 and selector portion 150 may be connected to the wiring line 120.

Figure 4:
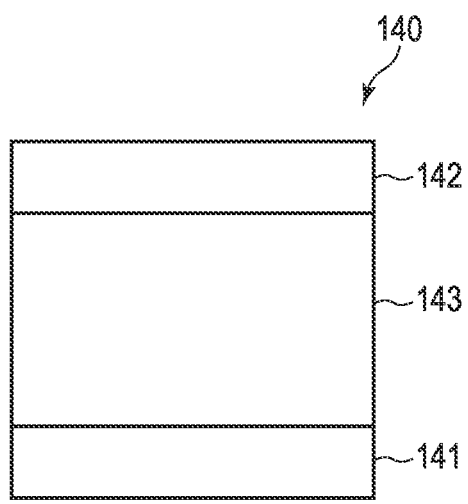
FIG. 4 is a cross-sectional view schematically showing the configuration of a resistance change memory portion according to the first embodiment.

FIG. 4 is a cross-sectional view schematically showing the configuration of the resistance change memory portion 140.

The resistance change memory portion 140 includes an electrode 141, electrode 142, and resistance change material layer 143 provided between the electrode 141 and electrode 142. That is, the resistance change memory portion 140 has a structure in which the electrode 141, resistance change material layer 143, and electrode 142 are stacked in the Z-direction of FIG. 2.

The resistance change memory portion 140 is a phase change memory (PCM) resistance change memory portion and can selectively exhibit one of the low-resistance state and high-resistance state. The resistance change material layer 143 of the resistance change memory portion 140 contains therein antimony (Sb) and tellurium (Te). The resistance change material layer 143 is formed of, for example, GeSbTe containing therein germanium (Ge), antimony (Sb), and tellurium (Te).

In the resistance change memory portion 140, the resistance change material layer 143 generates heat by a write signal, whereby the internal structure of the resistance change material layer 143 is changed. More specifically, the resistance change material layer 143 exhibits a crystalline state (low-resistance state, set state) or amorphous state (high-resistance state, reset state) according to the write signal.

Figure 5:
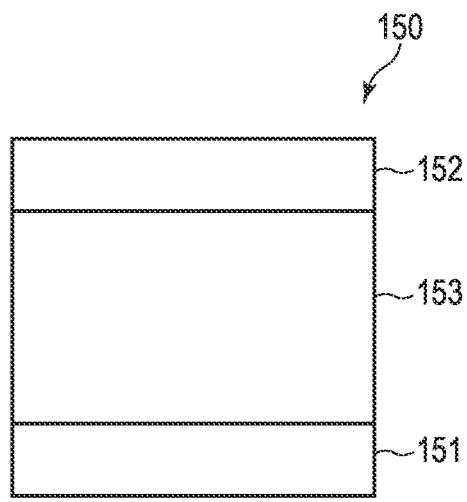
FIG. 5 is a cross-sectional view schematically showing the configuration of a selector portion (switching portion) according to the first embodiment.

FIG. 5 is cross-sectional view schematically showing the configuration of the selector portion (switching portion) 150.

The selector portion 150 includes an electrode 151, electrode 152, and selector material layer (switching material layer) 153 provided between the electrode 151 and electrode 152. That is, the selector portion 150 has a structure in which the electrode 151, selector material layer 153, and electrode 152 are stacked in the Z-direction of FIG. 2.

The selector portion 150 has a nonlinear current-voltage characteristic and basically exhibits one of the on-state and off-state. The selector material layer (switching material layer) 153 contains therein germanium (Ge), arsenic (As), and at least one of selenium (Se) and tellurium (Te). The selector material layer 153 is formed of, for example, GeAsSe containing therein germanium (Ge), arsenic (As), and selenium (Se) or GeAsTe containing therein germanium (Ge), arsenic (As), and tellurium (Te).

It should be noted that the electrode of the resistance change memory portion 140 on the selector portion 150 side and electrode of the selector portion 150 on the resistance change memory portion 140 side may be made common as one electrode. For example, in the examples shown in FIGS. 2 to 5, the electrode 141 of the resistance change memory portion 140 and electrode 152 of the selector portion 150 may be made common.

Further, the wiring line (wiring line 110, wiring line 120) may be used as the electrode of the resistance change memory portion 140 or electrode of the selector portion 150. For example, in the examples shown in FIGS. 2 to 5, the wiring line 110 may be used as the electrode 151 of the selector portion 150 and wiring line 120 may be used as the electrode 142 of the resistance change memory portion 140.

Figure 6:
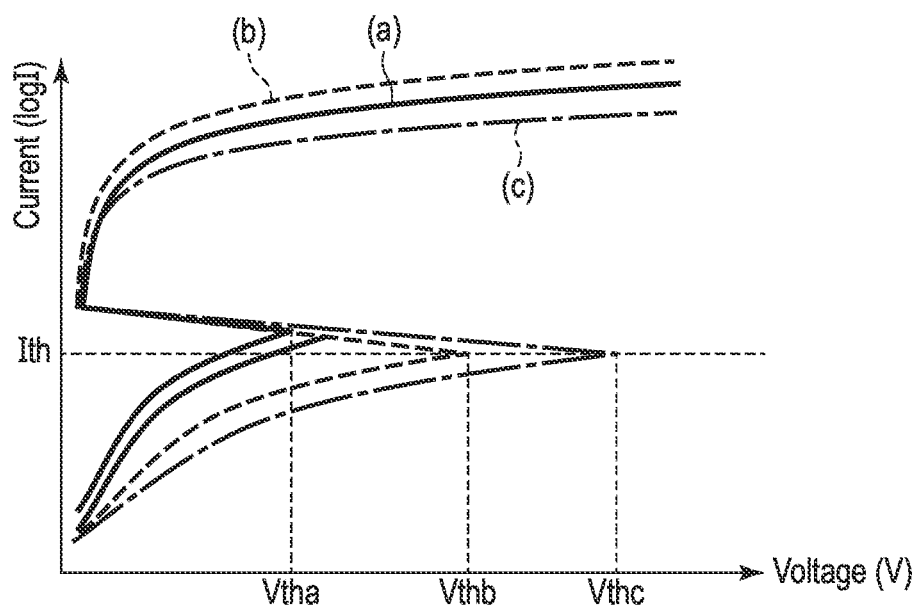
FIG. 6 is a view showing the current-voltage characteristic of each of the resistance change memory portion, selector portion, and memory cell according to the first embodiment.

FIG. 6 is a view showing the current-voltage characteristic of each of the resistance change memory portion 140, selector portion 150, and memory cell 130. In FIG. 6, (a) is the current-voltage characteristic of the resistance change memory portion 140, (b) is current-voltage characteristic of the selector portion 150, and (c) is current-voltage characteristic of the memory cell 130.

When the voltage to be applied to the resistance change memory portion 140 reaches the threshold voltage Vtha, the resistance change memory portion 140 makes a transition from the high-resistance state to the low-resistance state. When the voltage to be applied to the selector portion 150 reaches the threshold voltage Vthb, the selector portion 150 makes a transition from the off-state to the on-state. Further, when the resistance change memory portion 140 is in the low-resistance state, the resistance value of the resistance change memory portion 140 is sufficiently lower as compared with the off resistance of the selector portion 150, and hence the threshold voltage of the memory cell 130 is approximately equal to Vthb. When the resistance change memory portion 140 is in the high-resistance state, the resistance value of the resistance change memory portion 140 becomes a magnitude which cannot be disregarded relatively to the off resistance of the selector portion 150, and hence the threshold voltage of the memory cell 130 becomes Vthc. Accordingly, a read voltage is set between the threshold voltage Vthb and threshold voltage Vthc.

FIG. 7 is a block diagram showing the functional configuration of the read/write circuit 200 shown in FIG. 1.

The read/write circuit 200 has a function of applying a voltage to the memory cell 130 through the wiring line 110 at the time of a read operation and at the time of a write operation and includes a voltage applying circuit 210.

FIG. 8 is a block diagram showing the functional configuration of the read/write circuit 300 shown in FIG. 1.

The read/write circuit 300 has a function of applying a voltage to the memory cell 130 through the wiring line 120 at the time of a read operation and at the time of a write operation and includes a voltage applying circuit 310. Further, the read/write circuit 300 has a function of reading data stored in the memory cell 130 through the wiring line 120 at the time of a read operation and includes a determining circuit 320 configured to determine data read from the memory cell 130.

In the memory device of this embodiment, it is possible to store four-value data in the memory cell 130. More specifically, it is possible to further set, in addition to the two states (low-resistance state, high-resistance state) set to the resistance change memory portion 140, two states to the selector portion 150. Accordingly, on the basis of the two states of the resistance change memory portion 140 and two states of the selector portion 150, it is possible to set four states to the memory cell 130, and it is possible to store four-value data in the memory cell 130.

Figure 9:
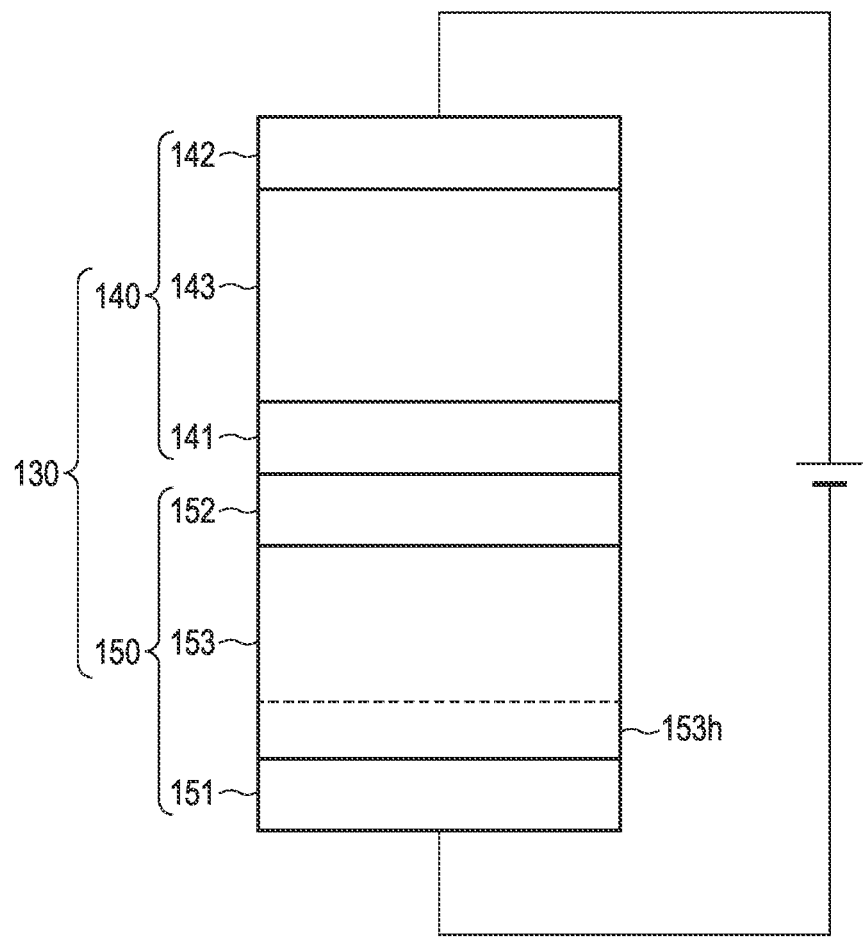
FIG. 9 is a view schematically showing the state according to the first embodiment where a write voltage is applied to the memory cell in such a manner that the potential on the resistance change memory portion side becomes higher than the potential on the selector portion side.

FIG. 9 is a view schematically showing the state where a write voltage is applied to the memory cell 130 in such a manner that the potential on the resistance change memory portion 140 side becomes higher than the potential on the selector portion 150 side. Hereinafter, voltage application of such a polarity is referred to as voltage application of the positive polarity. In the voltage application of the positive polarity, inside the selector portion 150, defects are distributed in such a manner that the defect density becomes higher on the electrode 151 side than on the electrode 152 side. That is, a high defect density area 153h is caused on the electrode 151 side.

Figure 10:
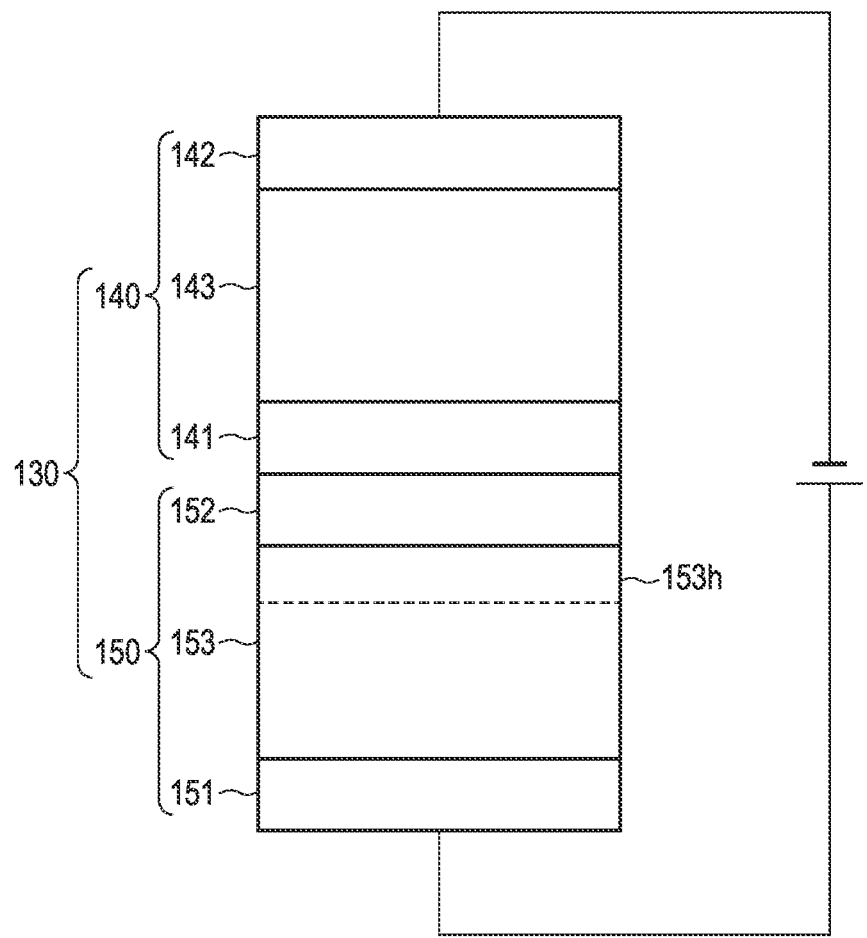
FIG. 10 is a view schematically showing the state according to the first embodiment where a write voltage is applied to the memory cell in such a manner that the potential on the resistance change memory portion side becomes lower than the potential on the selector portion side.

FIG. 10 is a view schematically showing the state where a write voltage is applied to the memory cell 130 in such a manner that the potential on the resistance change memory portion 140 side becomes lower than the potential on the selector portion 150 side. Hereinafter, voltage application of such a polarity is referred to as voltage application of the negative polarity. In the voltage application of the negative polarity, inside the selector portion 150, defects are distributed in such a manner that the defect density becomes higher on the electrode 152 side than on the electrode 151 side. That is, a high defect density area 153h is caused on the electrode 152 side.

For example, in the case where the selector material layer 153 is formed of GeAsSe, when a write voltage of the positive polarity is applied to the memory cell 130, negatively charged Se atoms (Se−) are diffused to the electrode 152 side by the electric field and Joule heat. As a result, the Se concentration on the electrode 151 side is lowered and defect density on the electrode 151 side becomes higher. That is, the high defect density area 153h is caused on the electrode 151 side. On the other hand, when a write voltage of the negative polarity is applied to the memory cell 130, the high defect density area 153h is caused on the electrode 152 side.

As described above, the defect density distribution in the selector portion 150 differs between the case of voltage application of the positive polarity and case of voltage application of the negative polarity. It is possible to set two states to the selector portion 150 on the basis of such a difference in the defect density distribution.

Figure 11:
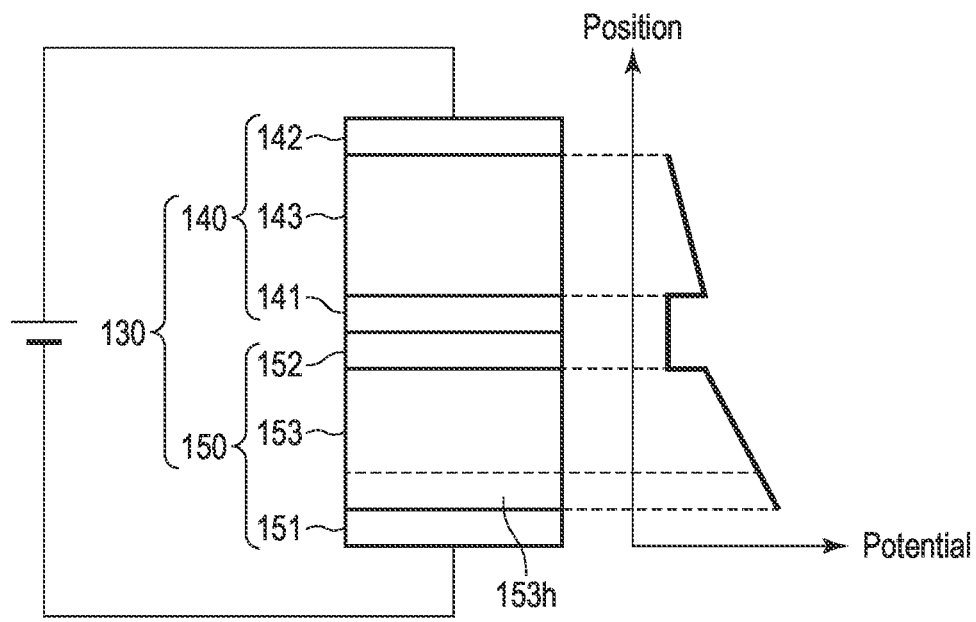
FIG. 11 is a view showing the state according to the first embodiment where a read voltage of the positive polarity is applied to the memory cell when a write voltage of the positive polarity is applied to the memory cell in such a manner that defect distribution shown in FIG. 9 is created in the selector portion.

FIG. 11 shows the state where a read voltage of the positive polarity is applied to the memory cell 130 when a write voltage of the positive polarity is applied to the memory cell 130 in such a manner that defect distribution shown in FIG. 9 is created in the selector portion 150.

Figure 12:
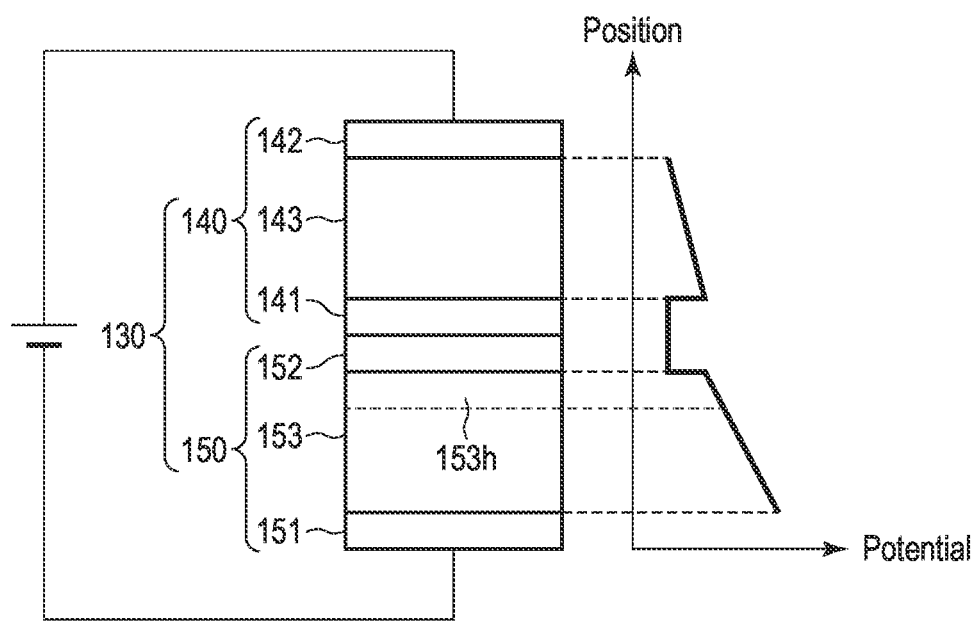
FIG. 12 is a view showing the state according to the first embodiment where a read voltage of the positive polarity is applied to the memory cell when a write voltage of the negative polarity is applied to the memory cell in such a manner that defect distribution shown in FIG. 10 is created in the selector portion.

FIG. 12 shows the state where a read voltage of the positive polarity is applied to the memory cell 130 when a write voltage of the negative polarity is applied to the memory cell 130 in such a manner that defect distribution shown in FIG. 10 is created in the selector portion 150.

It should be noted that in the following description, for the sake of convenience, the state where voltage application of the positive polarity is exerted on the memory cell 130 in such a manner that the high defect density area 153h is caused on the electrode 151 side of the selector portion 150 shown in FIG. 9 is referred to as the positive polarity state. Further, the state where voltage application of the negative polarity is exerted on the memory cell 130 in such a manner that the high defect density area 153h is caused on the electrode 152 side of the selector portion 150 shown in FIG. 10 is referred to as the negative polarity state.

As shown in FIG. 11 and FIG. 12, the potential with respect to the electrons becomes higher on the electrode 151 side. For this reason, in the case of FIG. 11, the high defect density area 153h exists in the area where the potential is higher. Conversely, in the case of FIG. 12, the high defect density area 153h exists in the area where the potential is lower. As a result, as will be described below, in the case of FIG. 11, the on-voltage of the selector portion 150 becomes lower and the threshold voltage of the whole memory cell 130 becomes lower than in the case of FIG. 12.

When the current flowing through the selector portion 150 reaches the threshold current Ith, the selector portion 150 makes a transition to the on-state. When a read voltage of the positive polarity is applied to the memory cell 130, if the high defect density area 153h exists on the electrode 151 side as shown in FIG. 11, electron tunneling becomes liable to occur by the influence of the trap assist current (conduction through defect level). As a result, the current of the selector portion 150 reaches the threshold current Ith at a low voltage and threshold voltage Vth becomes lower. That is, the on-voltage of the selector portion 150 becomes lower and threshold voltage of the whole memory cell 130 also becomes lower. On the other hand, when the high defect density area 153h exists on the electrode 152 side as shown in FIG. 12, the on-voltage of the selector portion 150 becomes higher as compared with the case of FIG. 11 and threshold voltage of the whole memory cell 130 also becomes higher.

As described above, in this embodiment, it is possible to set the two states (positive polarity state, negative polarity state) to the selector portion 150 according to the defect state (defect density distribution state) of the selector portion 150. Accordingly, in this embodiment, it is possible to set the four states to the memory cell 130 and store the four-value data in the memory cell 130 on the basis of the two states (low-resistance state, high-resistance state) of the resistance change memory portion 140 and two states (positive polarity state, negative polarity state) of the selector portion 150.

Figure 13:
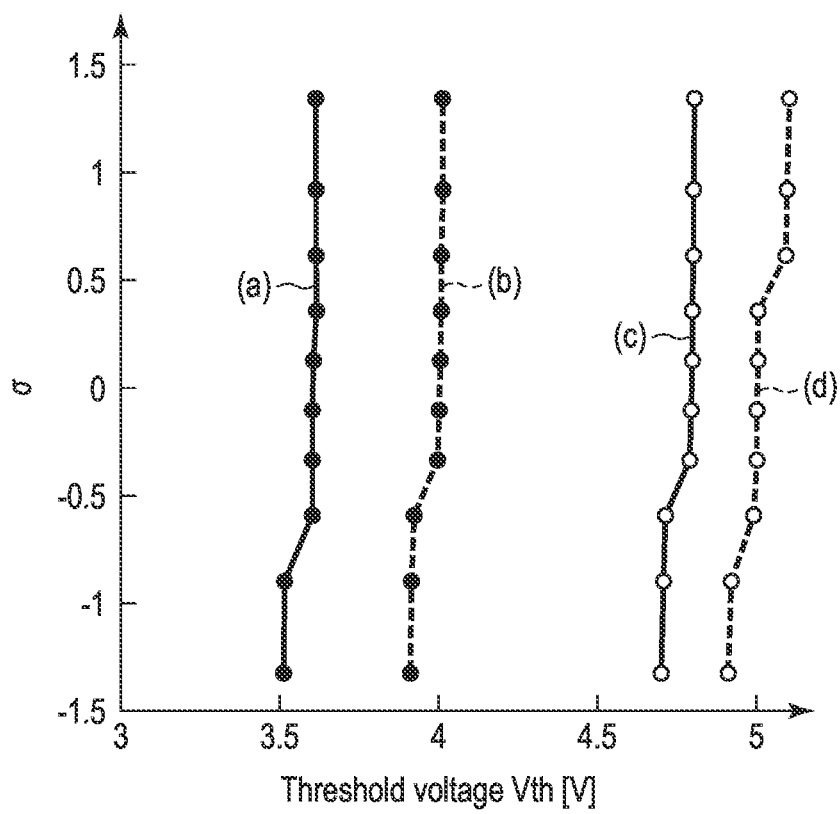
FIG. 13 is a view showing a relationship according to the first embodiment between the threshold voltage Vth of the memory cell and standard deviation σ when a read voltage of the positive polarity is applied to the memory cell.

FIG. 13 is a view showing a relationship between the threshold voltage Vth of the memory cell 130 and standard deviation σ with respect to the aforementioned four states when a read voltage of the positive polarity is applied to the memory cell 130.

In FIG. 13, the line (a) relates to the case where the resistance change memory portion 140 is in the low-resistance state and selector portion 150 is in the positive polarity state (hereinafter referred to as the first memory state), line (b) relates to the case where the resistance change memory portion 140 is in the low-resistance state and selector portion 150 is in the negative polarity state (hereinafter referred to as the second memory state), line (c) relates to the case where the resistance change memory portion 140 is in the high-resistance state and selector portion 150 is in the positive polarity state (hereinafter referred to as the third memory state), and line (d) relates to the case where the resistance change memory portion 140 is in the high-resistance state and selector portion 150 is in the negative polarity state (hereinafter referred to as the fourth memory state).

As shown in FIG. 13, between the threshold voltage of the first memory state and threshold voltage of the second memory state, between the threshold voltage of the second memory state and threshold voltage of the third memory state, and between the threshold voltage of the third memory state and threshold voltage of the fourth memory state, sufficient threshold voltage differences are obtained in all the cases.

As described above, in this embodiment, by setting the two states (low-resistance state, high-resistance state) to the resistance change memory portion 140 and by setting the two states (positive polarity state, negative polarity state) to the selector portion 150, it is possible to set the four states to the memory cell 130 and store the four-value data in the memory cell 130.

Next, an operation of the memory device according to this embodiment will be described.

Figure 14:
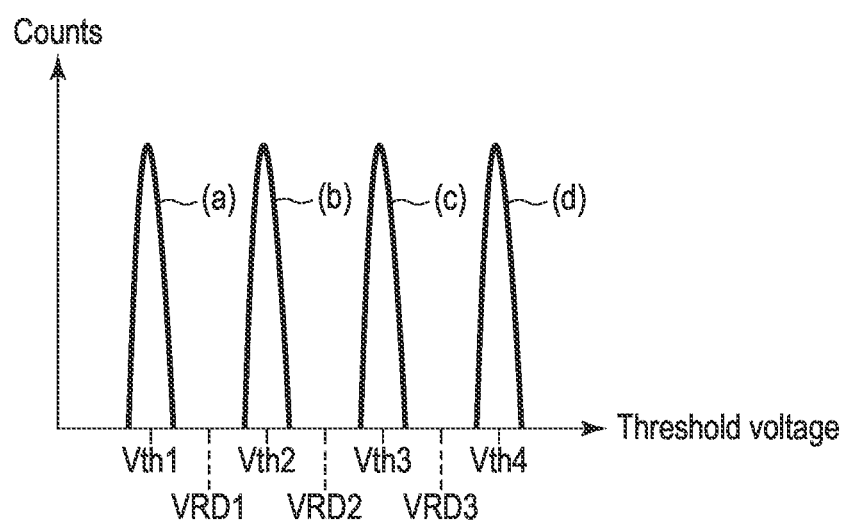
FIG. 14 is a view schematically showing the distribution characteristic of the threshold voltage Vth of the memory cell of the case where a read voltage of the positive polarity is applied to the memory cell when data stored in the memory cell is read, the distribution characteristic being according to the first embodiment.

FIG. 14 is a view schematically showing the distribution characteristic of the threshold voltage Vth of the memory cell 130 of the case where a read voltage of the positive polarity is applied to the memory cell 130 when data set to the memory cell 130 is read. That is, FIG. 14 is a figure schematically showing the distribution characteristic of the threshold voltage Vth of the memory cell 130 of the case where a read voltage is applied to the memory cell 130 by the voltage applying circuits 210 and 310 shown in FIG. 7 and FIG. 8 through the wiring line 110 and wiring line 120. The axis of abscissas shows the threshold voltage Vth of the memory cell 130 and axis of ordinate shows the counts of the memory cells corresponding to the threshold voltage Vth of the axis of abscissas.

The distribution (a) of FIG. 14 relates to the case where first data corresponding to the first memory state (low-resistance state/positive polarity state) is set to memory cell 130. In this case, the memory cell 130 has a first threshold voltage Vth1 of the positive polarity with respect to the read voltage of the positive polarity.

The distribution (b) of FIG. 14 relates to the case where second data corresponding to the second memory state (low-resistance state/negative polarity state) is set to the memory cell 130. In this case, the memory cell 130 has a second threshold voltage Vth2 of the positive polarity having an absolute value greater than the absolute value of the first threshold voltage Vth1 with respect to the read voltage of the positive polarity.

The distribution (c) of FIG. 14 relates to the case where third data corresponding to the third memory state (high-resistance state/positive polarity state) is set to the memory cell 130. In this case, the memory cell 130 has a third threshold voltage Vth3 of the positive polarity having an absolute value greater than the absolute value of the second threshold voltage Vth2 with respect to the read voltage of the positive polarity.

The distribution (d) of FIG. 14 relates to the case where fourth data corresponding to the fourth memory state (high-resistance state/negative polarity state) is set to the memory cell 130. In this case, the memory cell 130 has a fourth threshold voltage Vth4 of the positive polarity having an absolute value greater than the absolute value of the third threshold voltage Vth3 with respect to the read voltage of the positive polarity.

The memory cell 130 has the aforementioned four types of threshold voltage distribution, and hence by setting a read voltage VRD1 between the threshold voltage distribution (a) and threshold voltage distribution (b), setting a read voltage VRD2 between the threshold voltage distribution (b) and threshold voltage distribution (c), and setting a read voltage VRD3 between the threshold voltage distribution (c) and threshold voltage distribution (d), it is possible to determine the four states (four-value data) of the memory cell 130.

Next, a voltage applying operation (write operation) to be carried out to set the first to fourth memory states to the memory cell 130 will be described.

Figure 15:
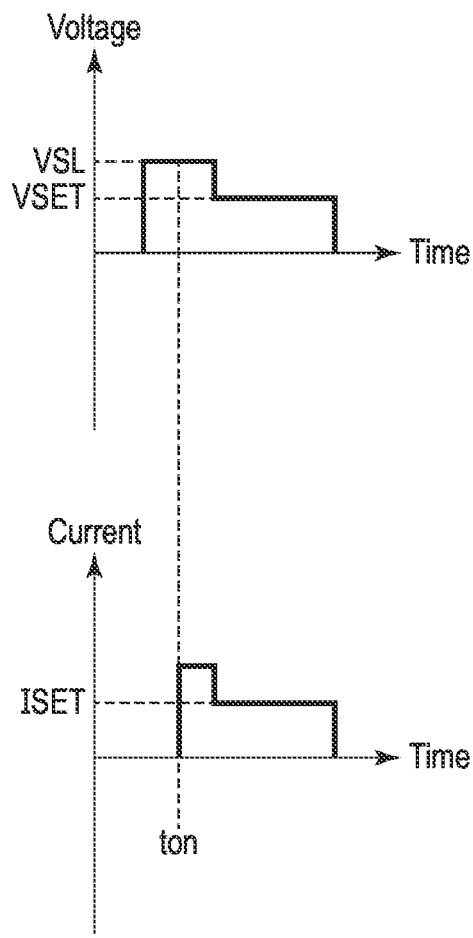
FIG. 15 is a view showing a voltage applying operation according to the first embodiment at the time when a first memory state (low-resistance state/positive polarity state) is set to the memory cell.

FIG. 15 is a view showing a voltage applying operation at the time when the first memory state (low-resistance state/positive polarity state) is set to the memory cell 130. More specifically, FIG. 15 is a timing chart showing the voltage to be applied to the memory cell 130 and current flowing through the memory cell 130.

First, a voltage is applied between the wiring line 110 and the wiring line 120, whereby a voltage VSL of the positive polarity is applied to the memory cell 130. This voltage VSL is a voltage for setting the selector portion 150 to the on-state and is greater than the threshold voltage Vth of the memory cell 130. When it becomes the time ton, the selector portion 150 enters the on-state and a current flows through the memory cell 130. Thereafter, a voltage is applied between the wiring line 110 and the wiring line 120, whereby a voltage VSET of the positive polarity is applied to the memory cell 130. This voltage VSET is a voltage for setting the resistance change memory portion 140 to the low-resistance state (set state, crystalline state) and is less than the voltage VSL. By such an operation, the first data corresponding to the first memory state (low-resistance state/positive polarity state) is set to the memory cell 130.

Figure 16:
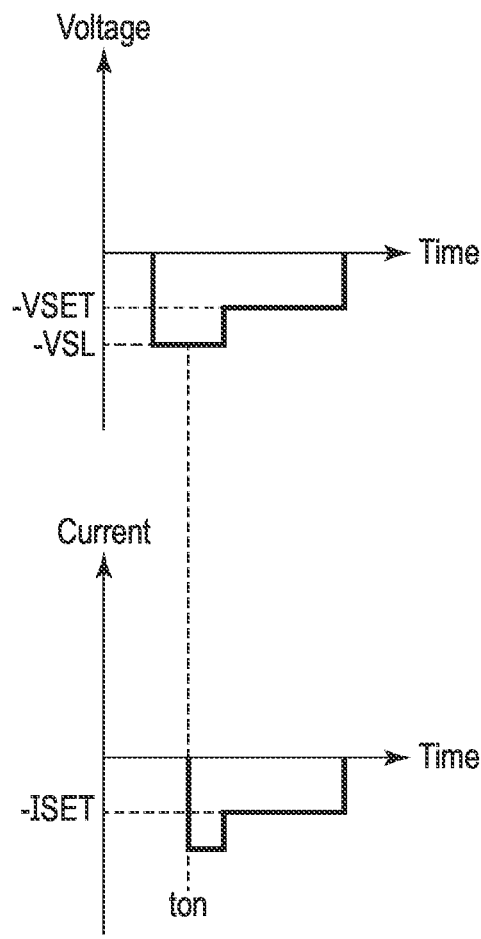
FIG. 16 is a view showing a voltage applying operation according to the first embodiment at the time when a second memory state (low-resistance state/negative polarity state) is set to the memory cell.

FIG. 16 is a view showing a voltage applying operation at the time when the second memory state (low-resistance state/negative polarity state) is set to the memory cell 130. More specifically, FIG. 16 is a timing chart showing a voltage to be applied to the memory cell 130 and current flowing through the memory cell 130.

First, a voltage is applied between the wiring line 110 and the wiring line 120, whereby a voltage −VSL of the negative polarity is applied to the memory cell 130. This voltage −VSL is a voltage for setting the selector portion 150 to the on-state and the absolute value thereof is greater than the absolute value of the threshold voltage −Vth of the memory cell 130. When it becomes the time ton, the selector portion 150 enters the on-state and current flows through the memory cell 130. Thereafter, a voltage is applied between the wiring line 110 and the wiring line 120, whereby a voltage −VSET of the negative polarity is applied to the memory cell 130. This voltage −VSET is a voltage for setting the resistance change memory portion 140 to the low-resistance state (set state, crystalline state) and the absolute value thereof is less than the absolute value of the voltage −VSL. By such an operation, the second data corresponding to the second memory state (low-resistance state/negative polarity state) is set to the memory cell 130.

Figure 17:
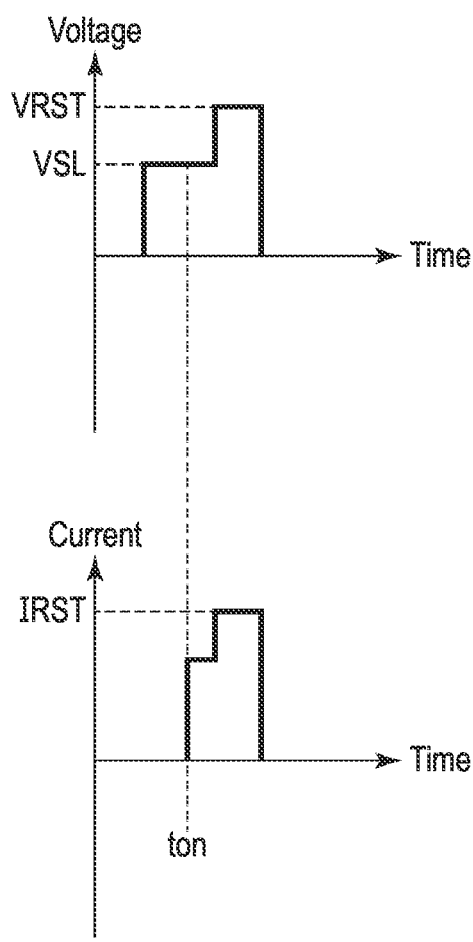
FIG. 17 is a view showing a voltage applying operation according to the first embodiment at the time when a third memory state (high-resistance state/positive polarity state) is set to the memory cell.

FIG. 17 is a view showing a voltage applying operation at the time when the third memory state (high-resistance state/positive polarity state) is set to the memory cell 130. More specifically, FIG. 17 is a timing chart showing a voltage to be applied to the memory cell 130 and current flowing through the memory cell 130.

First, a voltage is applied between the wiring line 110 and the wiring line 120, whereby a voltage VSL of the positive polarity is applied to the memory cell 130. This voltage VSL is a voltage for setting the selector portion 150 to the on-state and is greater than the threshold voltage Vth of the memory cell 130. When it becomes the time ton, the selector portion 150 enters the on-state and a current flows through the memory cell 130. Thereafter, a voltage is applied between the wiring line 110 and the wiring line 120, whereby a voltage VRST of the positive polarity is applied to the memory cell 130. This voltage VRST is a voltage for setting the resistance change memory portion 140 to the high-resistance state (reset state, amorphous state) and is greater than the voltage VSL. By such an operation, the third data corresponding to the third memory state (high-resistance state/positive polarity state) is set to the memory cell 130.

Figure 18:
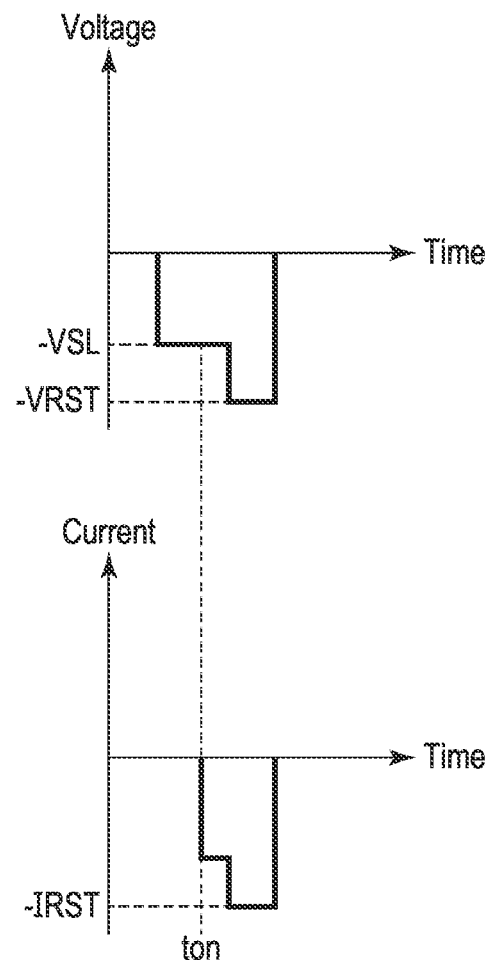
FIG. 18 is a view showing a voltage applying operation according to the first embodiment at the time when a fourth memory state (high-resistance state/negative polarity state) is set to the memory cell.

FIG. 18 is a view showing a voltage applying operation at the time when the fourth memory state (high-resistance state/negative polarity state) is set to the memory cell 130. More specifically, FIG. 18 is a timing chart showing a voltage to be applied to the memory cell 130 and current flowing through the memory cell 130.

First, a voltage is applied between the wiring line 110 and the wiring line 120, whereby a voltage −VSL of the negative polarity is applied to the memory cell 130. This voltage −VSL is a voltage for setting the selector portion 150 to the on-state and an absolute value thereof is greater than the absolute value of the threshold voltage −Vth of the memory cell 130. When it becomes the time ton, the selector portion 150 enters the on-state and a current flows through the memory cell 130. Thereafter, a voltage is applied between the wiring line 110 and the wiring line 120, whereby a voltage −VRST of the negative polarity is applied to the memory cell 130. This voltage −VRST is a voltage for setting the resistance change memory portion 140 to the high-resistance state (reset state, amorphous state) and an absolute value thereof is greater than the absolute value of the voltage −VSL. By such an operation, the fourth data corresponding to the fourth memory state (high-resistance state/negative polarity state) is set to the memory cell 130.

In the manner described above, it is possible to set the first to fourth states to the memory cell 130 and it is also possible to store the first to fourth data items in the memory cell 130.

It should be noted that although in the voltage applying operation shown in FIGS. 15 to 18, the absolute value of the voltage VSET of the positive polarity and absolute value of the voltage −VSET of the negative polarity are identical to each other, the absolute value of one of the above voltages may be within the range of 80% to 120% of the absolute value of the other of the voltages. Likewise, although the absolute value of the voltage VRST of the positive polarity and absolute value of the voltage −VRST of the negative polarity are identical to each other, the absolute value of one of the above voltages may be within the range of 80% to 120% of the absolute value of the other of the voltages.

Next, a voltage applying operation (read operation) to be carried out to read the first to fourth data items from the memory cell 130 will be described.

Figure 19:
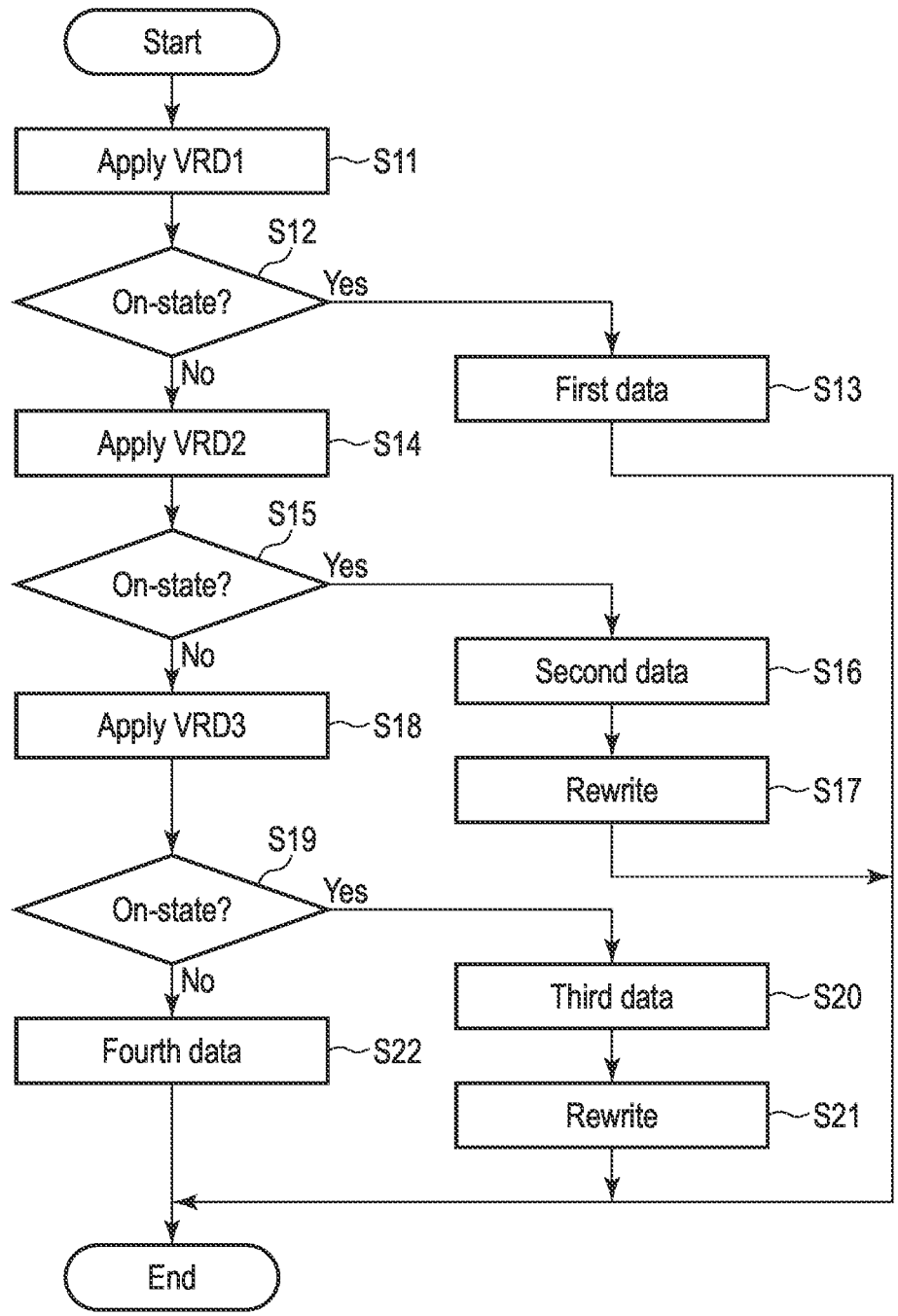
FIG. 19 is a flowchart showing a read operation according to the first embodiment.

FIG. 19 is a flowchart showing a read operation.

Figure 20:
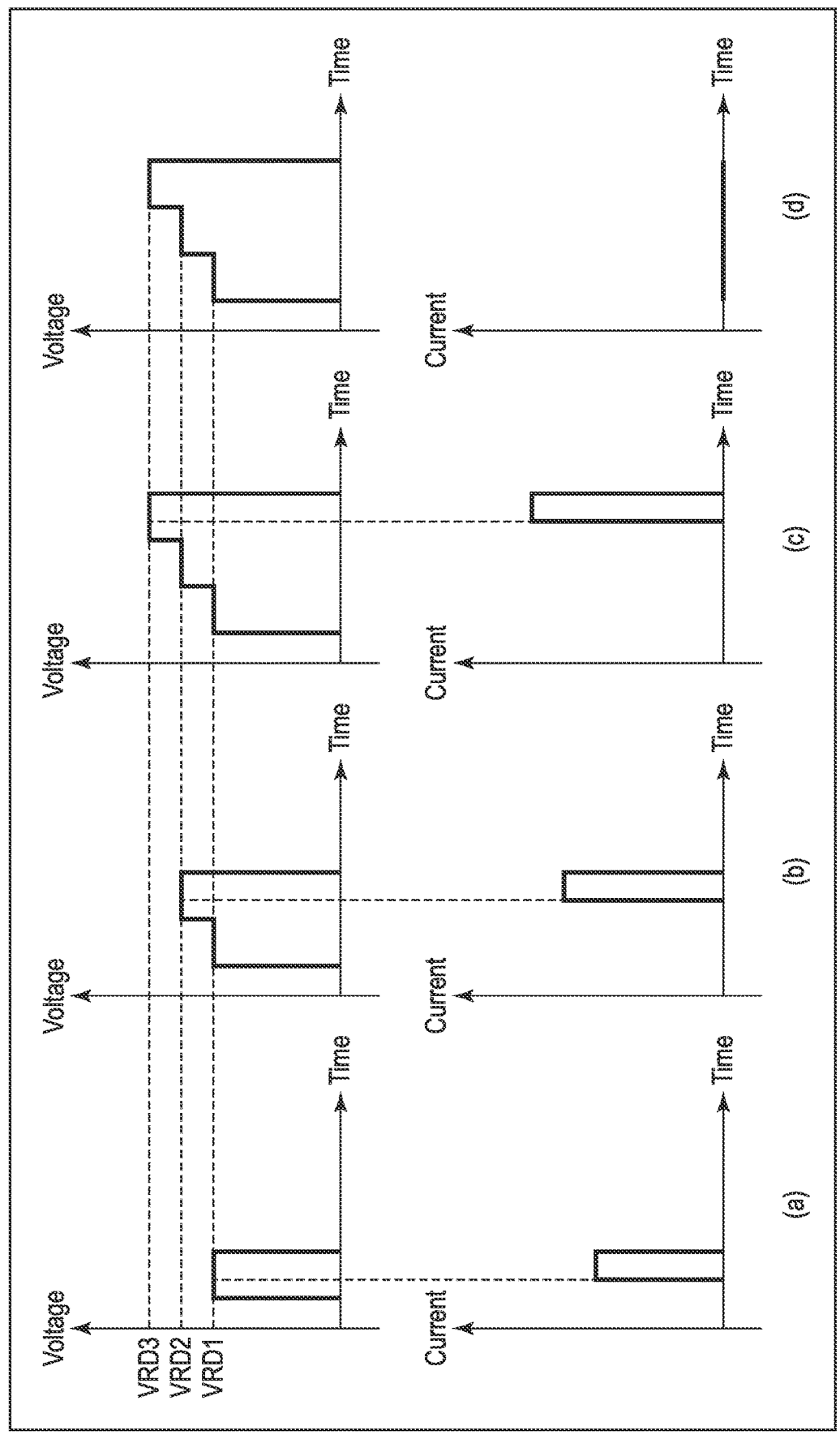
FIG. 20 is a timing chart showing a voltage applying operation according to the first embodiment in the read operation.

FIG. 20 is a timing chart showing a voltage applying operation in the read operation. In FIG. 20, (a) to (d), the axis of abscissas shows time and axis of ordinate shows a voltage to be applied to the memory cell 130 by the voltage applying circuit 210 of FIG. 7 and voltage applying circuit 310 of FIG. 8 through the wiring line 110 and wiring line 120 and current (flowing through the memory cell 130) flowing between the wiring line 110 and wiring line 120.

Figure 21:
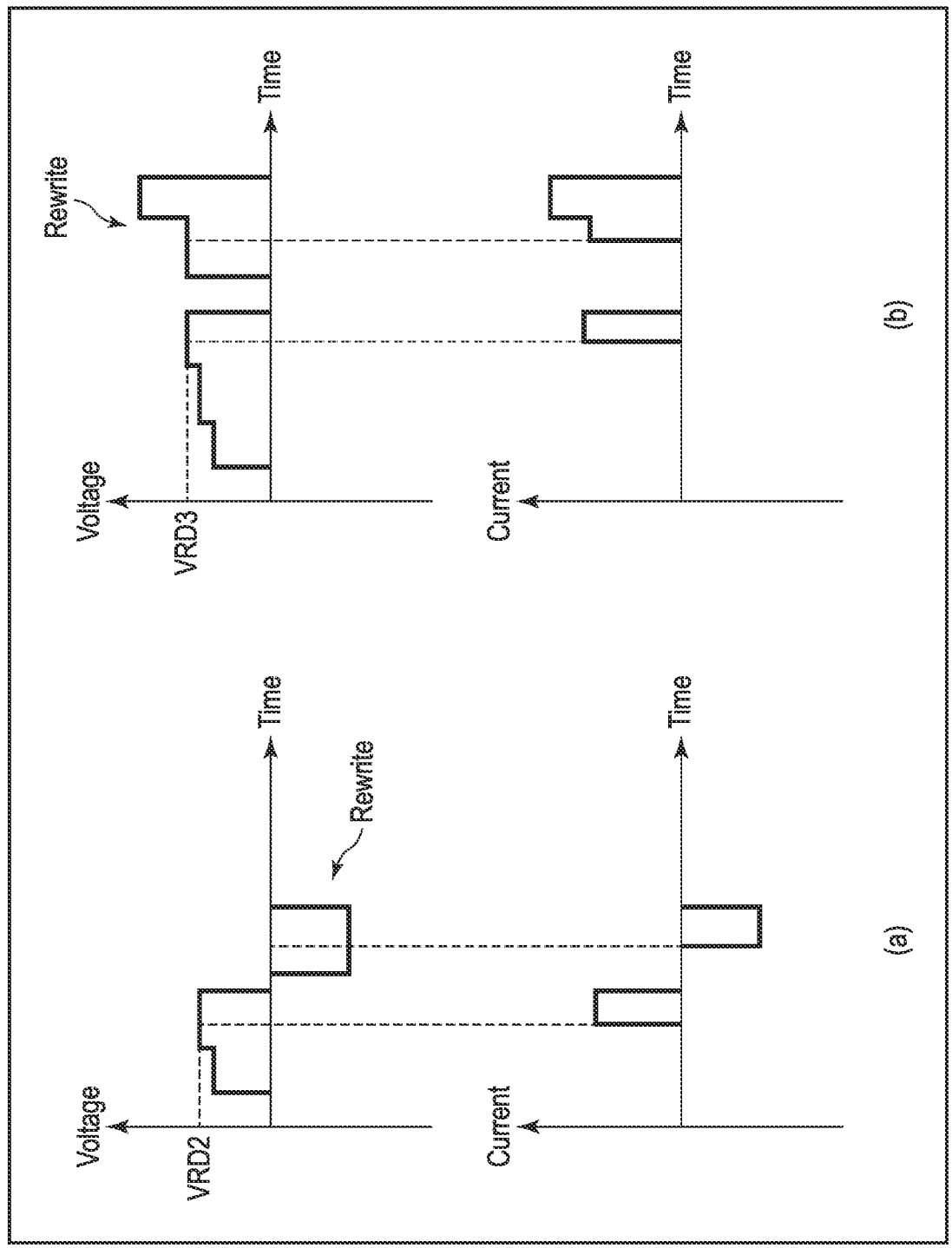
FIG. 21 is a timing chart showing a voltage applying operation according to the first embodiment at the time when a rewrite is carried out.

FIG. 21 is a timing chart showing a voltage applying operation at the time when a rewrite is carried out. The axis of abscissas shows time and axis of ordinate shows a voltage to be applied to the memory cell 130 by the voltage applying circuit 210 of FIG. 7 and voltage applying circuit 310 of FIG. 8 through the wiring line 110 and wiring line 120 and current (flowing through the memory cell 130) flowing between the wiring line 110 and wiring line 120.

First, as shown in FIG. 20 (*a*), the read voltage VRD1 is applied to the memory cell 130 (S11). More specifically, the read voltage VRD1 having the positive polarity and having an absolute value between the absolute value of the first threshold voltage Vth1 and absolute value of the second threshold voltage Vth2 is applied to the memory cell 130.

When the read voltage VRD1 is applied to the memory cell 130, if the memory cell 130 enters the on-state (if an on-current flows through the memory cell 130), the determining circuit 320 of FIG. 8 determines that the first data corresponding to the first memory state (low-resistance state/positive polarity state) is stored in the memory cell 130 (S12, S13).

If the memory cell 130 does not enter the on-state, i.e., if it is not determined that the first data is stored in the memory cell 130, a read voltage VRD2 is applied to the memory cell 130 as shown in FIG. 20 (*b*) (S14). More specifically, the read voltage VRD2 having the positive polarity and having an absolute value between the absolute value of the second threshold voltage Vth2 and absolute value of the third threshold voltage Vth3 is applied to the memory cell 130.

When the read voltage VRD2 is applied to the memory cell 130, if the memory cell 130 enters the on-state (if an on-current flows through the memory cell 130), the determining circuit 320 of FIG. 8 determines that the second data corresponding to the second memory state (low-resistance state/negative polarity state) is stored in the memory cell 130 (S15, S16).

Subsequently, the memory cell 130 is subjected to a rewrite (S17). That is, a voltage for setting the second data again is applied to the memory cell 130. More specifically, after applying the read voltage VRD2 of the positive polarity to the memory cell 130 as shown in FIG. 21 (*a*), a rewrite voltage of the negative polarity is applied to the memory cell 130. In the state where the read voltage VRD2 is applied to the memory cell 130, the resistance change memory portion 140 is kept in low-resistance state (crystalline state), and hence the rewrite voltage is used to set the defect density distribution of the selector portion 150 again.

If the memory cell 130 does not enter the on-state, i.e., if it is not determined that the second date is stored in the memory cell 130, a read voltage VRD3 is applied to the memory cell 130 as shown in FIG. 20 (*c*) (S18). More specifically, the read voltage VRD3 having the positive polarity and having an absolute value between the absolute value of the third threshold voltage Vth3 and absolute value of the fourth threshold voltage Vth4 is applied to the memory cell 130.

When the read voltage VRD3 is applied to the memory cell 130, if the memory cell 130 enters the on-state (if an on-current flows through the memory cell 130), the determining circuit 320 of FIG. 8 determines that the third data corresponding to the third memory state (high-resistance state/positive polarity state) is stored in the memory cell 130 (S19, S20).

Subsequently, the memory cell 130 is subjected to a rewrite (S21). That is, a voltage for setting the third data again is applied to the memory cell 130. More specifically, after applying the read voltage VRD3 of the positive polarity to the memory cell 130 as shown in FIG. 21 (*b*), a rewrite voltage of the positive polarity is applied to the memory cell 130. In the state where the read voltage VRD3 is applied to the memory cell 130, the resistance change memory portion 140 enters low-resistance state (crystalline state), and hence the rewrite voltage is used to set the resistance change memory portion 140 to the high-resistance state (amorphous state).

If the memory cell 130 does not enter the on-state, i.e., if it is not determined that the third data is stored in the memory cell 130, the determining circuit 320 of FIG. 8 determines that fourth data corresponding to the fourth memory state (high-resistance state/negative polarity state) is stored in the memory cell 130 (S22). In this case, no current flows through the memory cell 130 as shown in FIG. 20 (*d*), and hence the state of the memory cell 130 is maintained and no rewrite is carried out.

Next, a modified example of the read operation will be described.

Although in the read operation described above, only the read voltage of the positive polarity is applied to the memory cell 130, in this modified example, both a read voltage of the positive polarity and read voltage of the negative polarity are applied to the memory cell 130.

Figure 22:
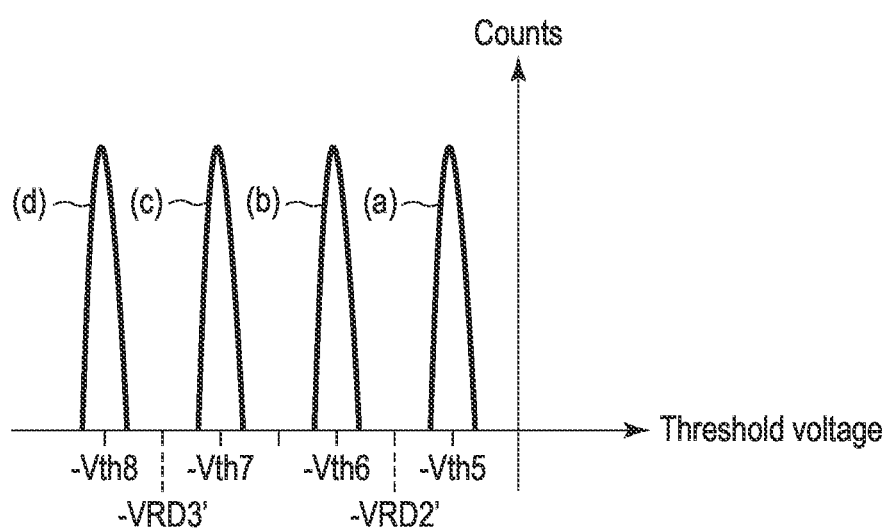
FIG. 22 is a view schematically showing the distribution characteristic of the threshold voltage Vth of the memory cell of a case where a read voltage of the negative polarity is applied to the memory cell when data stored in the memory cell is read, the distribution characteristic being according to the first embodiment.

FIG. 22 is a view schematically showing the distribution characteristic of the threshold voltage Vth of the memory cell 130 of a case where a read voltage of the negative polarity is applied to the memory cell 130 when data stored in the memory cell 130 is read. The axis of abscissas shows the threshold voltage Vth of the memory cell 130 and axis of ordinate shows the counts of the memory cells corresponding to the threshold voltage Vth of the axis of abscissas.

The distribution (a) of FIG. 22 relates to the case where the second data corresponding to the second memory state (low-resistance state/negative polarity state) is set to the memory cell 130. In this case, the memory cell 130 has a fifth threshold voltage −Vth5 with respect to the read voltage of the negative polarity.

The distribution (b) of FIG. 22 relates to the case where the first data corresponding to the first memory state (low-resistance state/positive polarity state) is set to the memory cell 130. In this case, the memory cell 130 has a sixth threshold voltage −Vth6 of the negative polarity having an absolute value greater than the absolute value of the fifth threshold voltage −Vth5 with respect to the read voltage of the negative polarity.

The distribution (c) of FIG. 22 relates to the case where the fourth data corresponding to the fourth memory state (high-resistance state/negative polarity state) is set to the memory cell 130. In this case, the memory cell 130 has a seventh threshold voltage −Vth7 of the negative polarity having an absolute value greater than the absolute value of the sixth threshold voltage −Vth6 with respect to the read voltage of the negative polarity.

The distribution (d) of FIG. 22 relates to the case where the third data corresponding to the third memory state (high-resistance state/positive polarity state) is set to the memory cell 130. In this case, the memory cell 130 has an eighth threshold voltage −Vth8 of the negative polarity having an absolute value greater than the absolute value of the seventh threshold voltage −Vth7 with respect to the read voltage of the negative polarity.

By using a read voltage of the positive polarity and read voltage of the negative polarity on the basis of the threshold voltage distribution shown in FIG. 14 and threshold voltage distribution shown in FIG. 22, it is possible to reduce the number of times the rewrite is carried out. More specifically, a read voltage VRD1 of the positive polarity is set between the threshold voltage distribution (a) and threshold voltage distribution (b) which are shown in FIG. 14, read voltage −VRD2' of the negative polarity is set between the threshold voltage distribution (a) and threshold voltage distribution (b) which are shown in FIG. 22, read voltage −VRD3' of the negative polarity is set between the threshold voltage distribution (c) and threshold voltage distribution (d) which are shown in FIG. 22 and, thereafter a voltage of the negative polarity is applied. Thereby, it is possible to determine the four states (four-value data) of the memory cell 130 and make the number of times of the rewrite once.

Figure 23:
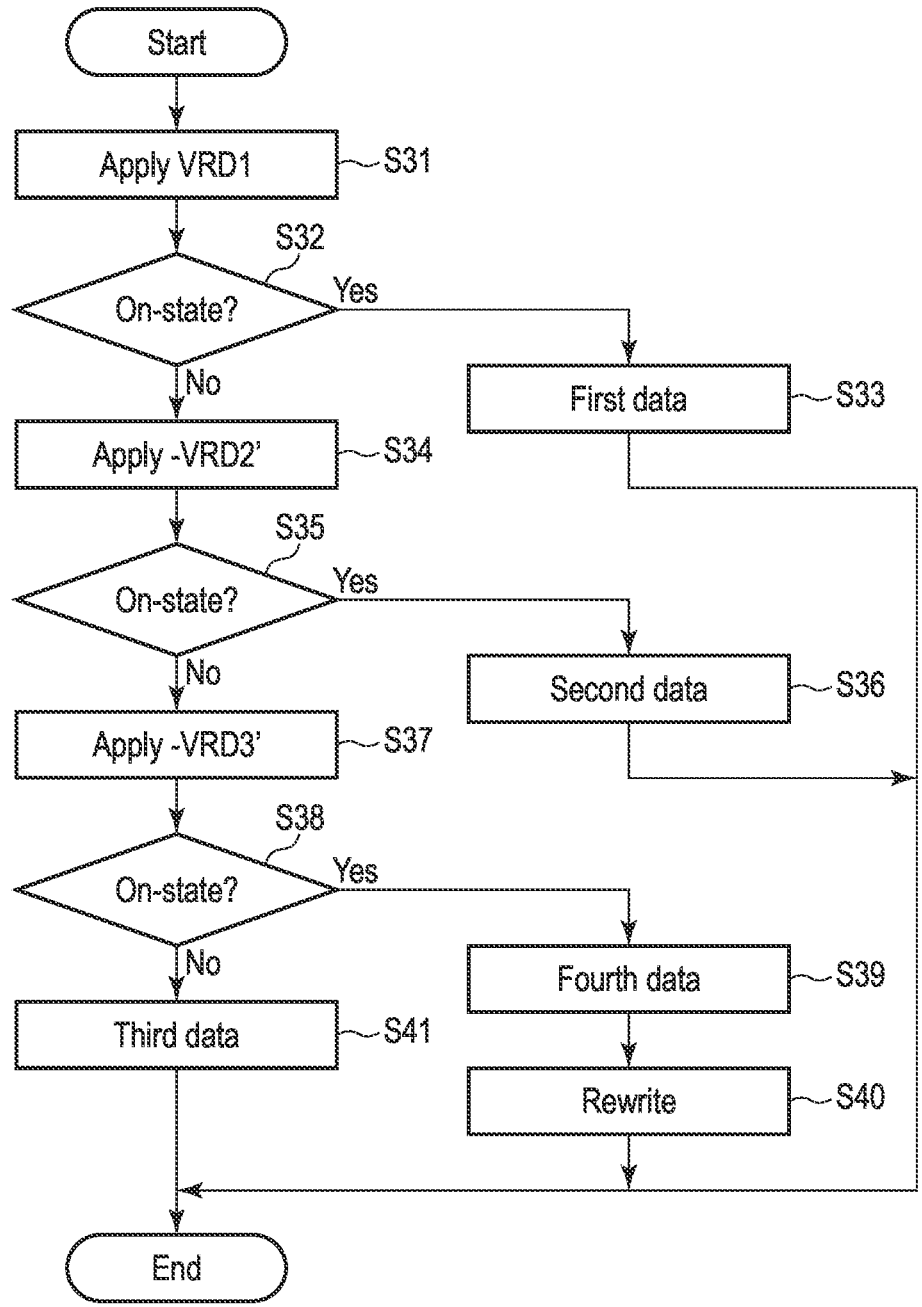
FIG. 23 is a flowchart showing the read operation according to a modified example of the first embodiment.

FIG. 23 is a flowchart showing the read operation in this modified example.

Figure 24:
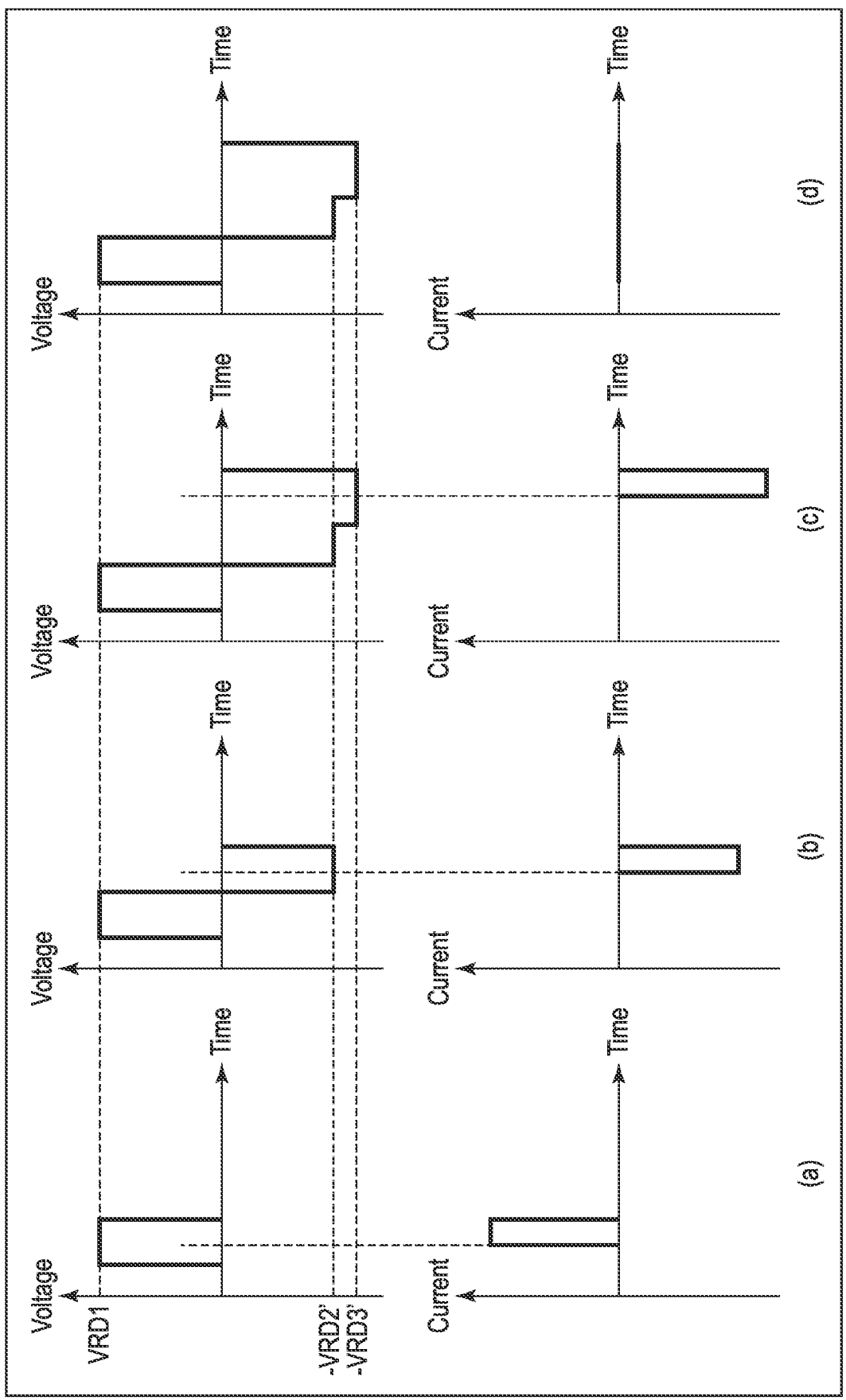
FIG. 24 is a timing chart showing the voltage applying operation in the read operation, the voltage applying operation being according to the modified example of the first embodiment.

FIG. 24 is a timing chart showing the voltage applying operation in the read operation. The axis of abscissas and axis of ordinate of FIG. 24 are identical to the axis of abscissas and axis of ordinate of FIG. 20.

Figure 25:
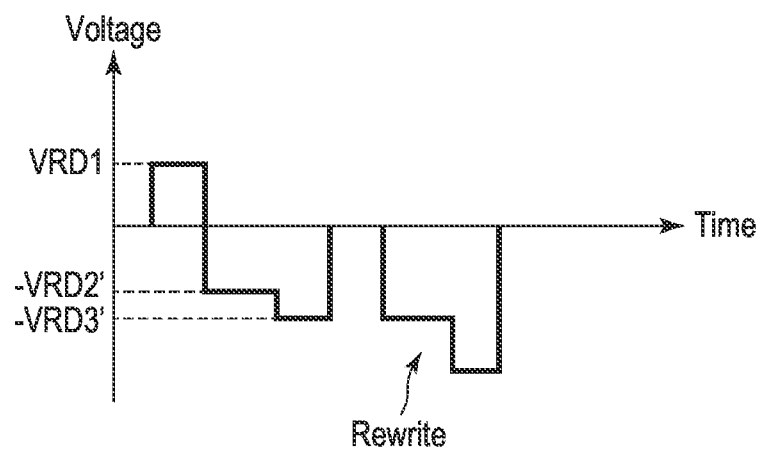
FIG. 25 is a timing chart showing the voltage applying operation at the time when a rewrite is carried out, the voltage applying operation being according to the modified example of the first embodiment.

FIG. 25 is a timing chart showing the voltage applying operation at the time when a rewrite is carried out. The axis of abscissas and axis of ordinate of FIG. 25 are identical to the axis of abscissas and axis of ordinate of FIG. 21.

First, as shown in FIG. 24 (*a*), the read voltage VRD1 is applied to the memory cell 130 (S31). More specifically, the read voltage VRD1 having the positive polarity and having an absolute value between the absolute value of the first threshold voltage Vth1 and absolute value of the second threshold voltage Vth2 is applied to the memory cell 130.

When the read voltage VRD1 is applied to the memory cell 130, if the memory cell 130 enters the on-state (if an on-current flows through the memory cell 130), the determining circuit 320 of FIG. 8 determines that the first data corresponding to the first memory state (low-resistance state/positive polarity state) is stored in the memory cell 130 (S32, S33).

If the memory cell 130 does not enter the on-state, i.e., if it is not determined that the first data is stored in the memory cell 130, a read voltage −VRD2' is applied to the memory cell 130 as shown in FIG. 24 (*b*) (S34). More specifically, the read voltage −VRD2' having the negative polarity and having an absolute value between the absolute value of the fifth threshold voltage −Vth5 and absolute value of the sixth threshold voltage −Vth6 is applied to the memory cell 130.

When the read voltage −VRD2' is applied to the memory cell 130, if the memory cell 130 enters the on-state (if an on-current flows through the memory cell 130), the determining circuit 320 of FIG. 8 determines that the second data corresponding to the second memory state (low-resistance state/negative polarity state) is stored in the memory cell 130 (S35, S36).

If the memory cell 130 does not enter the on-state, i.e., if it is not determined that the second data is stored in the memory cell 130, a read voltage −VRD3' is applied to the memory cell 130 as shown in FIG. 24 (*c*) (S37). More specifically, the read voltage −VRD3' having the negative polarity and having an absolute value between the absolute value of the seventh threshold voltage −Vth7 and absolute value of the eighth threshold voltage −Vth8 is applied to the memory cell 130.

When the read voltage −VRD3' is applied to the memory cell 130, if the memory cell 130 enters the on-state (if an on-current flows through the memory cell 130), the determining circuit 320 of FIG. 8 determines that the fourth data corresponding to the fourth memory state (high-resistance state/negative polarity state) is stored in the memory cell 130 (S38, S39).

Subsequently, the memory cell 130 is subjected to a rewrite (S40). That is, a voltage for setting the fourth data again is applied to the memory cell 130. More specifically, after applying the read voltage −VRD3' of the negative polarity to the memory cell 130 as shown in FIG. 25, a rewrite voltage of the negative polarity is applied to the memory cell 130. In the state where the read voltage −VRD3' is applied to the memory cell 130, the resistance change memory portion 140 enters the low-resistance state (crystalline state), and hence the rewrite voltage is used to set the resistance change memory portion 140 to the high-resistance state (amorphous state).

If the memory cell 130 does not enter the on-state, i.e., if it is not determined that the fourth data is stored in the memory cell 130, the determining circuit 320 of FIG. 8 determines that the third data corresponding to the third memory state (high-resistance state/positive polarity state) is stored in the memory cell 130 (S41). In this case, no current flows through the memory cell 130 as shown in FIG. 24 (d), and hence the state of the memory cell 130 is maintained and no rewrite is carried out.

As described above, in this modified example, it is possible to reduce the number of times of the rewrite to once and realize an improvement in the overall processing speed.

It should be noted that in the modified example described above, the steps of S34, S35, and S36 may be carried out at the beginning and thereafter steps of S31, S32, and S33 may be carried out.

Further, in the step of S37, the read voltage VRD3 of the positive polarity may be applied to the memory cell 130 in place of the read voltage −VRD3' of the negative polarity. In this case, operations identical to the steps S18 to S22 of FIG. 19 are carried out in place of the steps S37 to S41.

Second Embodiment

Next, a second embodiment will be described. It should be noted that the fundamental items are identical to the first embodiment, and descriptions of items already described in the first embodiment are omitted.

The overall configuration of a memory device (resistance change nonvolatile memory device) according to this embodiment is identical to the block diagram shown in FIG. 1.

Figure 26:
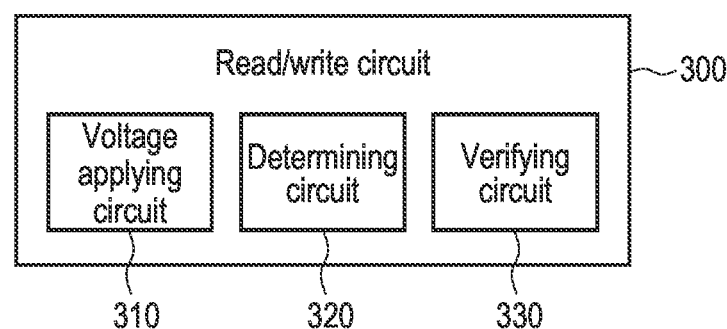
FIG. 26 is a block diagram showing the functional configuration of a read/write circuit according to a second embodiment and shown in FIG. 1.

FIG. 26 is a block diagram showing the functional configuration of a read/write circuit 300 shown in FIG. 1.

The read/write circuit 300 of this embodiment includes a voltage applying circuit 310, determining circuit 320, and verifying circuit 330. The fundamental functions of the voltage applying circuit 310 and determining circuit 320 are identical to the voltage applying circuit 310 and determining circuit 320 described in connection with FIG. 8 of the first embodiment. The verifying circuit 330 is a circuit configured to verify data read from the memory cell 130. A verify voltage is applied from the voltage applying circuit 310 to the memory cell 130 through the wiring line 110 and wiring line 120.

Next, an operation of the memory device according to this embodiment will be described.

In this embodiment, storage (memorization) is carried out by using binary data corresponding to the threshold voltage distribution characteristic (a) and threshold voltage distribution characteristic (d) which are shown in FIG. 14 of the first embodiment. That is, in the memory cell 130, first data corresponding to the first memory state (low-resistance state/positive polarity state) or fourth data corresponding to the fourth memory state (high-resistance state/negative polarity state) is stored. In the first memory state (low-resistance state/positive polarity state), the memory cell 130 has a first threshold voltage Vth1 of the positive polarity with respect to a read voltage of the positive polarity. In the fourth memory state (high-resistance state/negative polarity state), the memory cell 130 has a fourth threshold voltage Vth4 of the positive polarity with respect to a read voltage of the positive polarity.

Figure 27:
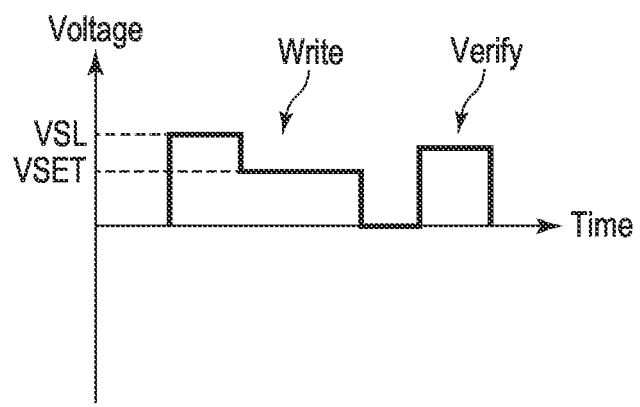
FIG. 27 is a timing chart showing a write operation of first data corresponding to a first memory state (low-resistance state/positive polarity state) and verify operation to be subsequently carried out, the first data write operation and verify operation being according to the second embodiment.

FIG. 27 shows a write operation of first data corresponding to the first memory state (low-resistance state/positive polarity state) and verify operation to be subsequently carried out.

That is, as in the case of the voltage applying operation of FIG. 15 of the first embodiment, a voltage VSL of the positive polarity is applied to the memory cell 130 through the wiring line 110 and wiring line 120. Thereafter, a voltage VSET of the positive polarity is applied to the memory cell 130 through the wiring line 110 and wiring line 120. Thereby, the first data corresponding to the first memory state (low-resistance state/positive polarity state) is written to the memory cell 130. After the first data is written, immediately (for example, within 10 μs) a verify voltage of the positive polarity having an absolute value between the absolute value of the first threshold voltage Vth1 and absolute value of the fourth threshold voltage Vth4 is applied to the memory cell 130 through the wiring line 110 and wiring line 120, and data written to the memory cell 130 is read, whereby the verify operation is carried out.

Figure 28:
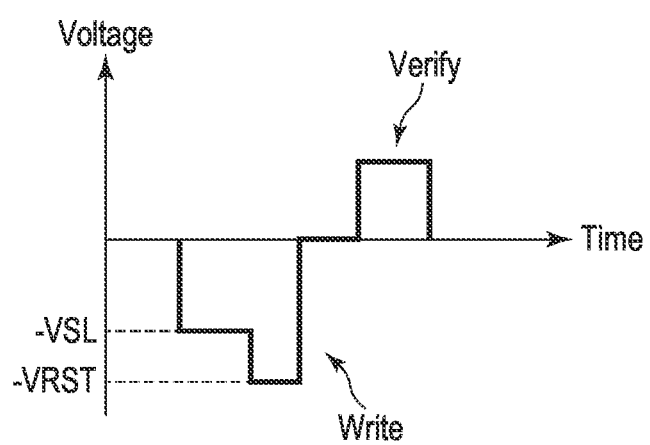
FIG. 28 is a timing chart showing a write operation of fourth data corresponding to a fourth memory state (high-resistance state/negative polarity state) and verify operation to be subsequently carried out, the fourth data write operation and verify operation being according to the second embodiment.

FIG. 28 shows a write operation of fourth data corresponding to the fourth memory state (high-resistance state/negative polarity state) and verify operation to be subsequently carried out.

That is, as in the case of the voltage applying operation of FIG. 18 of the first embodiment, a voltage −VSL of the negative polarity is applied to the memory cell 130 through the wiring line 110 and wiring line 120. Thereafter, a voltage −VRST of the negative polarity is applied to the memory cell 130 through the wiring line 110 and wiring line 120. Thereby, the fourth data corresponding to the fourth memory state (high-resistance state/negative polarity state) is written to the memory cell 130. After the fourth data is written, immediately (for example, within 10 μs) a verify voltage of the positive polarity having an absolute value between the absolute value of the first threshold voltage Vth1 and absolute value of the fourth threshold voltage Vth4 is applied to the memory cell 130 through the wiring line 110 and wiring line 120, and data written to the memory cell 130 is read, whereby the verify operation is carried out.

As described above, in this embodiment, the binary data is stored by using the first memory state (low-resistance state/positive polarity state) and fourth memory state (high-resistance state/negative polarity state), whereby, as will be described below, it is possible to securely store the binary data and carry out the verify operation immediately after the write operation.

In general, when write for setting the high-resistance state to the resistance change memory portion 140 is carried out, the threshold voltage of the memory cell 130 increases with the passage of time and thus the desired threshold voltage is obtained. For this reason, until the sufficient time elapses after write is carried out, the threshold voltage of the memory cell 130 does not reach the desired threshold voltage, and it is difficult to obtain, within a short time, a sufficient threshold voltage difference between the case where the high-resistance state is set and case where the low-resistance state is set.

In this embodiment, the binary data is stored by the use of the first memory state (low-resistance state/positive polarity state) and fourth memory state (high-resistance state/negative polarity state). In other words, the binary data corresponding to the threshold voltage distribution characteristic (a) and threshold voltage distribution characteristic (d) which are shown in FIG. 14 of the first embodiment is stored. As shown in FIG. 14, between the threshold voltage distribution characteristic (a) and threshold voltage distribution characteristic (d), a great threshold voltage difference is obtained. Accordingly, even immediately after write is carried out, it is possible to obtain a great threshold voltage difference. Therefore, in this embodiment, it is possible to securely store the binary data and carry out a verify operation immediately after the write is carried out.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device comprising:
a first wiring line extending in a first direction;
a second wiring line extending in a second direction intersecting the first direction;
a memory cell which is connected between the first wiring line and the second wiring line, includes a resistance change memory portion having a first resistance state and a second resistance state having resistance higher than that of the first resistance state and a switching portion connected in series to the resistance change memory portion, and stores data based on a resistance state set to the resistance change memory portion and a state of the switching portion; and
a voltage applying circuit which carries out, at a time of writing data to the memory cell, a voltage applying operation selected from a first voltage applying operation, a second voltage applying operation, a third voltage applying operation, and a fourth voltage applying operation, wherein
the first voltage applying operation is an operation of setting first data to the memory cell by applying a voltage of a first polarity to the memory cell through the first wiring line and the second wiring line and thereafter applying a first voltage to the memory cell through the first wiring line and the second wiring line to thereby set the resistance change memory portion to the first resistance state,
the second voltage applying operation is an operation of setting second data to the memory cell by applying a voltage of a second polarity opposite to the first polarity to the memory cell through the first wiring line and the second wiring line and thereafter applying a second voltage to the memory cell through the first wiring line and the second wiring line to thereby set the resistance change memory portion to the first resistance state, the third voltage applying operation is an operation of setting third data to the memory cell by applying a voltage of the first polarity to the memory cell through the first wiring line and the second wiring line and thereafter applying a third voltage to the memory cell through the first wiring line and the second wiring line to thereby set the resistance change memory portion to the second resistance state, and the fourth voltage applying operation is an operation of setting fourth data to the memory cell by applying a voltage of the second polarity to the memory cell through the first wiring line and the second wiring line and thereafter applying a fourth voltage to the memory cell through the first wiring line and the second wiring line to thereby set the resistance change memory portion to the second resistance state, wherein when reading data stored in the memory cell, the voltage applying circuit applies a read voltage to the memory cell through the first wiring line and the second wiring line, when the first data is stored in the memory cell, the memory cell has a first threshold voltage of the first polarity with respect to the read voltage of the first polarity, when the second data is stored in the memory cell, the memory cell has a second threshold voltage of the first polarity having an absolute value greater than that of the first threshold voltage with respect to the read voltage of the first polarity, when the third data is stored in the memory cell, the memory cell has a third threshold voltage of the first polarity having an absolute value greater than that of the second threshold voltage with respect to the read voltage of the first polarity, when the fourth data is stored in the memory cell, the memory cell has a fourth threshold voltage of the first polarity having an absolute value greater than that of the third threshold voltage with respect to the read voltage of the first polarity, when the second data is stored in the memory cell, the memory cell has a fifth threshold voltage of the second polarity with respect to the read voltage of the second polarity, when the first data is stored in the memory cell, the memory cell has a sixth threshold voltage of the second polarity having an absolute value greater than that of the fifth threshold voltage with respect to the read voltage of the second polarity, when the fourth data is stored in the memory cell, the memory cell has a seventh threshold voltage of the second polarity having an absolute value greater than that of the sixth threshold voltage with respect to the read voltage of the second polarity, and when the third data is stored in the memory cell, the memory cell has an eighth threshold voltage of the second polarity having an absolute value greater than that of the seventh threshold voltage with respect to the read voltage of the second polarity.

2. The memory device of claim 1, wherein the first voltage and the third voltage have the first polarity, and the second voltage and the fourth voltage have the second polarity.

3. The memory device of claim 1, further comprising a determining circuit which determines data read from the memory cell.

4. The memory device of claim 3, wherein when a first read voltage having the first polarity and having an absolute value between the absolute value of the first threshold voltage and the absolute value of the second threshold voltage is applied to the memory cell by the voltage applying circuit through the first wiring line and the second wiring line, if the memory cell becomes an on-state, the determining circuit determines that the first data is stored in the memory cell, in a case where it is not determined that the first data is stored in the memory cell, when a second read voltage having the first polarity and having an absolute value between the absolute value of the second threshold voltage and the absolute value of the third threshold voltage is applied to the memory cell by the voltage applying circuit through the first wiring line and the second wiring line, if the memory cell becomes the on-state, the determining circuit determines that the second data is stored in the memory cell, in a case where it is not determined that the second data is stored in the memory cell, when a third read voltage having the first polarity and having an absolute value between the absolute value of the third threshold voltage and the absolute value of the fourth threshold voltage is applied to the memory cell by the voltage applying circuit through the first wiring line and the second wiring line, if the memory cell becomes the on-state, the determining circuit determines that the third data is stored in the memory cell, and in a case where it is not determined that the second data is stored in the memory cell, when the third read voltage is applied to the memory cell by the voltage applying circuit through the first wiring line and the second wiring line, if the memory cell does not become the on-state, the determining circuit determines that the fourth data is stored in the memory cell.

5. The memory device of claim 4, wherein in a case where the determining circuit determines that the second data is stored in the memory cell, the voltage applying circuit applies, to the memory cell, a voltage for rewriting the second data to the memory cell through the first wiring line and the second wiring line, and in a case where the determining circuit determines that the third data is stored in the memory cell, the voltage applying circuit applies, to the memory cell, a voltage for rewriting the third data to the memory cell through the first wiring line and the second wiring line.

6. The memory device of claim 3, wherein when a first read voltage having the first polarity and having an absolute value between the absolute value of the first threshold voltage and the absolute value of the second threshold voltage is applied to the memory cell by the voltage applying circuit through the first wiring line and the second wiring line, if the memory cell becomes an on-state, the determining circuit determines that the first data is stored in the memory cell, in a case where it is not determined that the first data is stored in the memory cell, when a second read voltage having the second polarity and having an absolute value between the absolute value of the fifth threshold voltage and the absolute value of the sixth threshold voltage is applied to the memory cell by the voltage applying circuit through the first wiring line and the second wiring line, if the memory cell becomes the on-state, the determining circuit determines that the second data is stored in the memory cell, in a case where it is not determined that the second data is stored in the memory cell, when a third read voltage having the second polarity and having an absolute value between the absolute value of the seventh threshold voltage and the absolute value of the eighth threshold voltage is applied to the memory cell by the voltage applying circuit through the first wiring line and the second wiring line, if the memory cell becomes the on-state, the determining circuit determines that the fourth data is stored in the memory cell, and in a case where it is not determined that the second data is stored in the memory cell, when the third read voltage is applied to the memory cell by the voltage applying circuit through the first wiring line and the second wiring line, if the memory cell does not become the on-state, the determining circuit determines that the third data is stored in the memory cell.

7. The memory device of claim 6, wherein in a case where the determining circuit determines that the fourth data is stored in the memory cell, the voltage applying circuit applies, to the memory cell, a voltage for rewriting the fourth data to the memory cell through the first wiring line and the second wiring line.

8. The memory device of claim 1, wherein the resistance change memory portion is a phase change memory (PCM) type portion.

9. The memory device of claim 1, wherein a resistance change material layer of the resistance change memory portion has a crystalline state in a case of the first resistance state, and has an amorphous state in a case of the second resistance state.

10. The memory device of claim 1, wherein a resistance change material layer of the resistance change memory portion contains antimony (Sb) and tellurium (Te).

11. The memory device of claim 1, wherein a switching material layer of the switching portion contains germanium (Ge), arsenic (As), and at least one of selenium (Se) and tellurium (Te).

* * * * *